US006054714A

United States Patent [19]

Izutsu et al.

[11] Patent Number: 6,054,714

[45] Date of Patent: Apr. 25, 2000

[54] ELECTRON-BEAM IRRADIATION APPARATUS

[75] Inventors: Masahiro Izutsu; Naoaki Ogure, both of Tokyo, Japan

[73] Assignee: Ebara Corporation, Tokyo, Japan

[21] Appl. No.: 09/147,670

[22] PCT Filed: Aug. 8, 1997

[86] PCT No.: PCT/JP97/02775

§ 371 Date: Feb. 11, 1999

§ 102(e) Date: Feb. 11, 1999

[87] PCT Pub. No.: WO98/07175

PCT Pub. Date: Feb. 19, 1998

[30] Foreign Application Priority Data

Aug. 13, 1996 [JP] Japan .................................... 8-231322

[51] Int. Cl.[7] ...................................................... H01J 37/30

[52] U.S. Cl. .......................................................... 250/492.3

[58] Field of Search ............................. 250/492.3, 492.1, 250/398, 400

[56] References Cited

U.S. PATENT DOCUMENTS 5,801,387 9/1998 Nablo et al. ......................... 250/492.3

*Primary Examiner*—Kiet T. Nguyen

*Attorney, Agent, or Firm*—Oblon, Spivak, McClelland, Maier & Neustadt, P.C.

[57] ABSTRACT

An electron beam irradiation apparatus. The apparatus allows an electron beam which is generated in a vacuum container to pass through a window foil that separates the vacuum container from a process vessel. The beam irradiates gas containing moisture to thereby process the gas. The apparatus includes the vacuum container, the process vessel and the window foil. The window foil has a surface for contacting the wet gas and is made of titanium or an alloy containing titanium as its main component. The surface of the window foil is coated with one of the platinum metals such as palladium.

20 Claims, 2 Drawing Sheets

ELECTRON-BEAM IRRADIATION APPARATUS

BACKGROUND OF THE INVENTION

Field of the Invention

The present invention relates to an electron-beam irradiation apparatus for allowing electron beam generated in a vacuum container to pass through a window foil or window foils that partition the vacuum container from a process vessel and irradiating gas containing moisture or water (hereinafter referred to as "wet gas") such as flue gas in the process vessel with electron beam to thereby process or treat the gas, and more particularly to a structure of the above window foil.

DISCUSSION OF THE BACKGROUND

There has been known an electron-beam irradiation apparatus in which a filament is heated by causing electric current to flow therethrough to emit thermoelectrons which are then accelerated by applying a high voltage to produce electron beam in a vacuum container, and the produced electron beam passes through a window foil or window foils into a process vessel outside of the vacuum container to treat substance such as gas in the process vessel by irradiation of the electron beam. The electron-beam irradiation apparatus is used in a wide variety of fields including acceleration of chemical reaction of macromolecule, the sterilization of medical instruments, and many research and development activities. The electron-beam irradiation apparatus is also used to purify flue gas that is produced when fossil fuels such as coal and petroleum are combusted. Advantages offered by the use of electron beam as compared with X-rays and γ-rays are that an electron-beam source may be of a large capacity and a large amount of substance may be processed or treated at one time.

It has been known to add an alkaline agent such as ammonia or lime to flue gas which contains harmful materials including sulfur oxides (SOx), nitrogen oxides (NOx), hydrogen chloride (HCl) and the like, and then irradiate the flue gas with electron beam to convert the harmful materials into particulates for removal and recovery, as disclosed in Japanese laid-open patent publication No. 52-140499. According to the disclosed process, ammonia ($NH_3$) is added as the alkaline agent to the flue gas, and the flue gas is irradiated with electron beam to convert SOx into particles of ammonium sulfate and NOx into particles of ammonium nitrate, so that these particles can be recovered from the flue gas for use as fertilizer.

The electron beam generated in the vacuum container is taken out from the vacuum container by allowing the electron beam to pass through a thin metal film, i.e., a window foil that partitions the vacuum container of an electron beam accelerator from the process vessel. The window foil is required to be thick enough to withstand the pressure difference between pressure in the vacuum container and pressure in the process vessel. However, the window foil is required not to be excessively thick so that a large loss of energy of the electron beam is not caused when the electron beam passes through the window foil. Thus, the window foil having a thickness from ten to several tens of microns is practically used. If the flue gas to be treated by the electron beam contains pollutants of relatively low concentration, then only a primary window foil is placed between the vacuum container of the electron beam accelerator and the process vessel. However, if the flue gas contains a large amount of harmful materials including SOx, NOx, HCl and the like, as in flue gas discharged from a boiler, then a secondary window foil is added outwardly of the primary window foil such that the electron beam generated in the vacuum container passes through the primary and secondary window foils into the process vessel. In this case, a cooling chamber is defined between the primary and secondary window foils for allowing cooling gas such as cooling air to pass therethrough to cool the primary and secondary window foils. Owing to this structure, the flue gas is prevented from entering the vacuum container directly even when the secondary window foil directly contacting the flue gas is damaged.

Conventionally, each of the window foils for allowing the electron beam to pass therethrough is made of titanium or titanium alloy that has low specific gravity and high mechanical strength. However, it is known that when the wet gas is irradiated with electron beam, OH radicals are generated by collision of high-speed electrons with moisture molecules contained in the wet gas, thus causing corrosion to the surface of the window foil that contacts the wet gas. Particularly, if the gas contains moisture, and sulfur oxides (SOx) and/or nitrogen oxides (NOx), then the generated OH radicals react with SOx and/or Nox to produce strong acids such as sulfuric acid and nitric acid which accelerate the corrosion of the window foil.

When electron beam passes through a window foil or window foils, the electron beam loses its energy to produce heat. Thus, cooling gas such as cooling air is applied to the window foil or the window foils to cool the window foil or the window foils. If the temperature of the cooling gas is equal to or lower than the dew point of the wet gas that is irradiated with the electron beam, then moisture is condensed on the surface of the window foil that contacts the wet gas, thus causing the window foil to be highly corroded by the strong acids. It has been customary to increase the temperature of the cooling gas to a temperature equal to or higher than the dew point of the wet gas which is irradiated with electron beam. However, this conventional process is disadvantageous in that it requires a heat source and the cooling effect of the window foil is lowered because the temperature difference between the cooling gas and the surface of the window foil is small.

In order to prevent the window foil from being corroded, it has also been customary to use an alloy containing titanium and one of the platinum metals such as palladium, in place of titanium. If the proportion of the precious metal, i.e., one of the platinum metals in the alloy increases, then the specific gravity of the alloy increases to reduce the penetrability to the electron beam, and the hardness of the alloy also increases to make it difficult for the alloy to be worked into a foil. Consequently, there is a certain limit to the proportion of the precious metal in the alloy, and the resistance to corrosion of the window foil is limited.

SUMMARY OF THE INVENTION

It is therefore an object of the present invention to provide an electron-beam irradiation apparatus which has a window foil that is free of corrosion even when the window foil contacts wet gas or gas containing sulfur oxides and/or nitrogen oxides, and that does not lower penetrability to electron beam. The penetrability to electron beam is defined as "ability of the window foil to permit electron beam to pass therethrough".

According to the present invention, there is provided an electron-beam irradiation apparatus for irradiating wet gas containing moisture with electron beam, comprising: a vacuum container for generating electron beam; a process vessel for containing the wet gas; and a window foil for partitioning the vacuum container from the process vessel and allowing the electron beam to pass therethrough, the window foil having a surface for contacting the wet gas and being made of titanium or an alloy containing titanium as main component, and the surface being coated with one of the platinum metals.

The one of the platinum metals may have a weight ranging from 0.2 to 100 g per 1 $m^2$ of the surface of the window foil.

The window foil may be made of an alloy containing titanium, aluminum and vanadium.

The window foil may have a surface layer containing nitrogen and/or oxygen, the surface layer having a thickness of 0.2 $\mu$m or less, preferably 0.1 $\mu$m or less.

Cooling gas having a temperature of a dew point of the wet gas or below may be applied to the window foil to cool the window foil.

Water spray may be supplied to the surface of the window foil to cool the window foil.

According to the present invention, the window foil which allows electron beam to pass therethrough and has a surface for contacting wet gas is made of titanium or an alloy containing titanium as main component. The surface of the window foil which contacts the wet gas is coated with one of the platinum metals to prevent the contacting surface from being corroded.

Further, even if gas having a temperature equal to or lower than the dew point of the gas to be irradiated with electron beam is used as cooling gas, there is no fear of corrosion of the window foil due to dew condensation, and the cooling effect of the window foil can be improved. Therefore, it is not necessary to heat the cooling gas, the overall apparatus may be of compact structure, and hence energy saving can be achieved.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
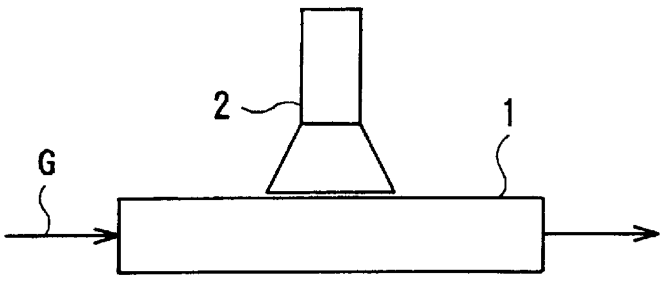
FIG. 1 is a schematic view of an electron-beam irradiation apparatus for irradiating gas with electron beam according to an embodiment of the present invention.

An electron-beam irradiation apparatus for irradiating gas such as flue gas containing sulfur oxides and/or nitrogen oxides, in addition to water, with electron beam often has two window foils, one of which is provided at a position closer to a vacuum container for separating an interior space of an electron beam accelerator (vacuum container) and the other of which is provided at a position closer to a process vessel for preventing gas such as flue gas from being brought into direct contact with the window foil closer to the vacuum container. The window foil closer to the process vessel is made of titanium, and has a surface which contacts gas such as flue gas in the process vessel and has palladium thereon by a palladium surface treatment. If an electron-beam irradiation apparatus has only one window foil closer to the vacuum container, then the surface of the window foil made of titanium which contacts gas such as flue gas has palladium thereon by a palladium surface treatment. If it is desirable from the standpoint of the palladium treatment process that the palladium surface treatment is applied to both surfaces of the window foil, then the both surfaces of the window foil may be treated by the palladium treatment process.

It has heretofore been practiced to treat a surface of titanium by the palladium treatment process to make the surface of titanium more resistant to corrosion. It has been widely recognized that titanium to which the palladium surface treatment is applied is as resistant to corrosion as an alloy containing titanium and about 0.1 to 0.2% of palladium (titanium-palladium alloy). According to the study of the inventors of the present application, it has been found that the palladium-treated surface of the window foil which contacts gas such as flue gas in the electron-beam irradiation apparatus for irradiating wet gas with electron beam is more resistant to corrosion than the window foil made of the titanium-palladium alloy.

Specifically, if gas contains sulfur oxides and/or nitrogen oxides, in addition to water, the difference between the corrosion resistance of the palladium-treated surface of the window foil and the corrosion resistance of the window foil made of the titanium-palladium alloy is extremely large. In this case, the window foil made of the titanium-palladium alloy exhibits quick corrosion that progresses when it starts to be used, whereas the palladium-treated surface of the window foil does not show substantial corrosion for a long period of time during its use. It is believed that no substantial corrosion is developed on the palladium-treated surface of the window foil because the environment in which the wet gas is irradiated with the electron beam is different from the ordinary corrosive environment due to acids or the like.

In the palladium surface treatment, it is not necessary to coat the entire surface of the window foil with palladium. Even if palladium is present in scattered regions on the surface of the window foil in microscopic observations, a current flows electrochemically between the regions of palladium and regions of titanium that are not coated with palladium, and the surface of the regions of titanium that are not coated with palladium is electrochemically oxidized to form a protective film thereon for corrosion resistance.

It is preferable to coat the surface of the window foil with palladium in a weight ranging from 0.2 to 100 g per 1 $m^2$ of the surface of the window foil.

If the weight of palladium per 1 $m^2$ of the surface of the window foil is smaller than 0.2 g, then no sufficient protective film is formed on the surface of the regions of titanium that are not coated with palladium. Further, in this case, when the deposited palladium is corroded even slightly, the corrosion resistance of the window foil is greatly lowered.

If the weight of palladium per 1 $m^2$ of the surface of the window foil is greater than 100 g, then the penetrability to the electron beam is reduced. Thus, the upper limit of the weight of palladium per 1 $m^2$ of the surface of the window foil is approximately 100 g.

Since the corrosion resistance of the window foil is greatly increased by treating, with palladium, the surface of the window foil which contacts gas such as flue gas, there is no fear of corrosion caused by dew condensation on the surface of the window foil which contacts the gas. Therefore, the temperature of cooling gas applied to the window foil can be equal to or lower than the dew point of the wet gas which is irradiated with electron beam. Conversely, when the cooling gas has a temperature equal to or lower than the dew point of the wet gas which is irradiated with electron beam, the temperature difference between the cooling gas and the surface of the window foil can be increased to cool the window foil with high efficiency.

When electron beam is applied to the wet gas, it has not been heretofore practiced to cool a window foil that allows the electron beam to pass therethrough by supplying water spray to the surface of the window foil which contacts the gas. Since the resistance to corrosion of the window foil is greatly increased by treating the surface of the window foil with palladium according to the present invention, it is not necessary to fear the generation of OH radicals or acids on the surface of the window foil, and hence the window foil can be cooled by supplying water spray to the surface of the window foil which contacts the gas. The cooling effect of the window foil is extremely improved by utilizing the latent heat of vaporization, and hence a large power required to apply cooling gas to the window foil is unnecessary.

Further, since the corrosion resistance of a window foil to which a palladium surface treatment is applied is remarkably improved, the window foil having a surface which contacts the gas to be treated is less susceptible to be damaged. Thus, it is not necessary to provide a secondary window foil at the side of the process vessel so as not to cause the window foil at the side of the electron beam accelerator as a vacuum container to contact the flue gas directly. In this case, the window foil at the side of the electron beam accelerator contacts the flue gas directly, and hence the cooling gas such as cooling air is applied to the surface of the window foil which contacts the flue gas or water spray is supplied to the surface of the window foil to cool the window foil. In case of supplying water spray, water droplets are evaporated completely in the process vessel by making the water droplets minute, thus generating no waste water from the process vessel.

The corrosion resistance of a window foil may be increased by coating the surface of the window foil made of titanium with one of the platinum metals other than palladium or applying one of the platinum metals other than palladium to scattered regions of the surface of the window foil made of titanium. The platinum metals include platinum, palladium, iridium and rhodium. The alloy of the platinum metals may be also used as coating material for the window foil. Further, an alloy containing titanium as main component may be used as a base metal of a window foil, and such alloy may have the same effect as titanium.

In case of forming titanium or titanium alloy into a foil by a rolling, a surface layer containing nitrogen and/or oxygen is formed on the foil depending on the rolling condition. In general, the surface layer containing nitrogen and/or oxygen weakens the binding power between palladium, and titanium or titanium alloy. Therefore, it is desirable that the surface layer containing nitrogen and/or oxygen of the surface of the foil has a thickness of 0.2 μm or less, preferably 0.1 μm or less. To make the surface layer containing nitrogen and/or oxygen of the surface of the foil thinner can be realized by lowering the temperature of rolling or carrying out rolling in an inert gas environment.

It has been found that titanium alloy containing aluminum and vanadium (Ti—Al—V alloy) and treated on its surface with palladium exhibits higher corrosion resistance than pure titanium treated on its surface with palladium. It is known that the Ti—Al—V alloy has higher mechanical strength than the pure titanium. Therefore, it is preferable to use a foil of Ti—Al—V alloy treated on its surface with palladium as a window foil of an electron-beam irradiation apparatus for irradiating wet gas with electron beam.

Next, embodiments of the present invention will be described below with reference to drawings.

Figure 2:
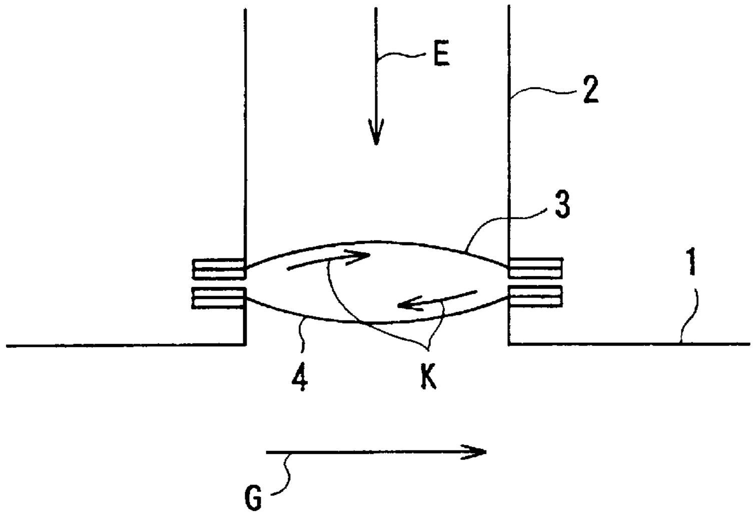
FIG. 2 is a cross-sectional view showing a window foil assembly which partitions a vacuum container from a process vessel in the electron-beam irradiation apparatus shown in FIG. 1.

FIG. 1 shows a flue gas treatment system incorporating an electron-beam irradiation apparatus of the present invention in which flue gas discharged from a fuel combustion facility such as a boiler is treated by irradiation of electron. As shown in FIG. 1, while a gas G containing moisture flows through the interior of a process vessel 1, the gas G is irradiated with electron beam which is generated by an electron beam accelerator 2. FIG. 2 shows a window foil assembly which partitions a vacuum container, i.e., the electron beam accelerator 2 from the process vessel 1. As shown in FIG. 2, the window foil assembly comprises a window foil 3 closer to the electron beam accelerator 2 and a window foil 4 closer to the process vessel 1. The window foils 3 and 4 are spaced from each other to form a space therebetween as a passage for cooling gas K such as cooling air.

Figure 3:
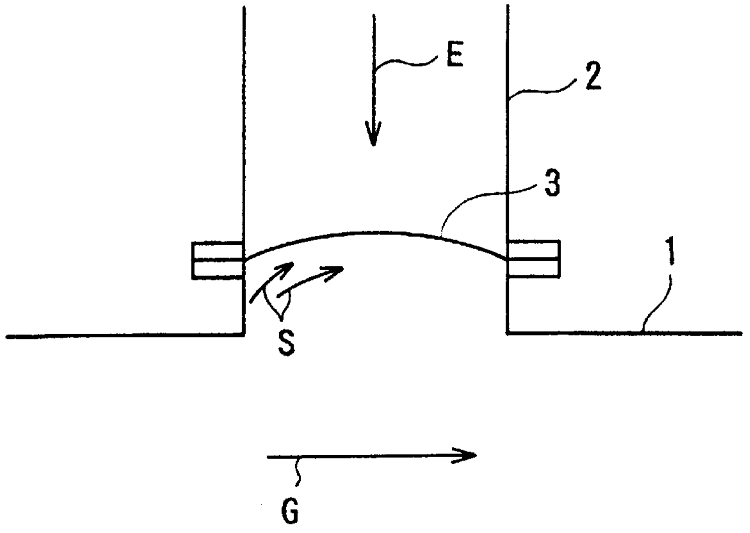
FIG. 3 is a cross-sectional view showing another type of a window foil assembly which partitions a vacuum container from a process vessel in the electron-beam irradiation apparatus shown in FIG. 1.

FIG. 3 shows another type of a window foil assembly which partitions a vacuum container, i.e., the electron beam accelerator 2 from the process vessel 1. In this case, there exists only one window foil 3, one surface of which contacts a gas G such as flue gas. The window foil 3 is cooled by supplying water spray S to the surface of the window foil 3 which contacts the gas G.

Experimental examples according to the present invention will be described below.

EXAMPLE 1

Air G containing 10% of moisture and having a temperature of 60° C. was introduced into the inlet of the process vessel 1 shown in FIG. 1. While the wet air G was flowing through the process vessel 1, it was irradiated with electron beam E which was generated by the electron beam accelerator 2 at an acceleration voltage of 500 kV and a current of 20 mA. Thereafter, the wet air G was discharged from the outlet of the process vessel 1. As shown in FIG. 2, the electron beam accelerator 2 and the process vessel 1 was connected to each other through the window foils 3 and 4. The electron beam E passed through the window foils 3 and 4 and was applied to the wet air G.

Figure 4:
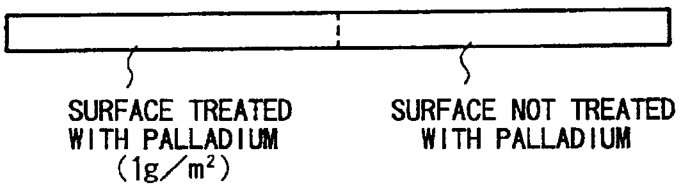
FIG. 4 is a view of a specimen used in an experimental example.

Cooling air of 20° C. was applied to the window foils 3 and 4 in the directions indicated by the arrows K in FIG. 2 to cool the window foils 3 and 4. The wet air G had a dew point of 46° C., and the cooling air had a temperature lower than the dew point of the wet air G. The window foil 4 closer to the process vessel 2 was made of pure titanium and had a thickness of 50 μm. Only half of the surface of the window foil 4 which contacts the wet air G was treated, i.e., coated, with palladium, as shown in FIG. 4. The weight of palladium which covers the surface of the window foil 4 which contacts the wet air G was 1 g per 1 $m^2$ of the surface of the window foil. A layer containing nitrogen and/or oxygen of the surface of the window foil made of pure titanium had a thickness of 0.1 μm or less.

After the wet air G was irradiated with electron beam for 120 hours, 240 hours and 360 hours, the weight of the window foil 4 was measured. Reduction in weight per 1 $m^2$ is shown in Table 1 below. The surface of the window foil 4 which was not treated with palladium suffered progressive corrosion from the beginning of its use, and the surface of the window foil 4 which was treated with palladium suffered no corrosion at all after those hours of irradiation by the electron beam E.

TABLE 1

| | Reduction in weight ($g/m^2$) | |
|---|---|---|
| Irradiation time (hours) | Window foil treated with palladium | Window foil not treated with palladium |
| 120 | 0 | 2 |
| 240 | 0 | 8 |
| 360 | 0 | 15 |

EXAMPLE 2

Air G containing 10% of moisture and 800 ppm of sulfur oxides and having a temperature of 60° C. was introduced into the inlet of the process vessel 1 shown in FIG. 1. While the wet air G was flowing through the process vessel 1, it was irradiated with electron beam E which was generated by the electron beam accelerator 2 at an acceleration voltage of 500 kV and a current of 20 mA. Thereafter, the wet air G was discharged from the outlet of the process vessel 1. The electron beam accelerator 2 was connected to the process vessel 1 in the same manner as Example 1, and the two window foils 3 and 4 were cooled in the same manner as Example 1. The window foil 4 was made of the same material and treated in the same manner as Example 1.

After the wet air G was irradiated with electron beam for 120 hours, 240 hours and 360 hours, the weight of the window foil 4 was measured. Reduction in weight per 1 $m^2$ is shown in Table 2 below. The surface of the window foil 4 which was not treated with palladium suffered progressive corrosion from the beginning of its use and was about to fracture after 360 hours of irradiation by the electron beam E, and the surface of the window foil 4 which was treated with palladium suffered no corrosion at all after those hours of irradiation by the electron beam E.

TABLE 2

| | Reduction in weight ($g/m^2$) | |
|---|---|---|
| Irradiation time (hours) | Window foil treated with palladium | Window foil not treated with palladium |
| 120 | 0 | 45 |
| 240 | 0 | 100 |
| 360 | 0 | 160 |

EXAMPLE 3

Air G containing 10% of moisture and 800 ppm of sulfur oxides and having a temperature of 60° C. was introduced into the inlet of the process vessel 1 shown in FIG. 1. While the wet air G was flowing through the process vessel 1, it was irradiated with electron beam E which was generated by the electron beam accelerator 2 at an acceleration voltage of 500 kV and a current of 20 mA. Thereafter, the wet air G was discharged from the outlet of the process vessel 1. The electron beam accelerator 2 was connected to the process vessel 1 in the same manner as Examples 1 and 2, and the two window foils 3 and 4 were cooled in the same manner as Examples 1 and 2. The window foil 4 was made of an alloy containing titanium and 0.15% of palladium, and had a thickness of 50 μm. As shown in FIG. 4, only half of the surface of the window foil 4 which contacts the wet air G was treated with palladium. The weight of the palladium that covered the surface of the window foil being in contact with the air was 1 g per 1 $m^2$, and a layer containing nitrogen and/or oxygen of the surface of the window foil made of the alloy containing titanium and palladium had a thickness of 0.1 μm or less.

After the wet air G was irradiated with electron beam for 120 hours, 240 hours and 360 hours, the weight of the window foil 4 was measured. Reduction in weight per 1 $m^2$ is shown in Table 3 below. The surface of the window foil 4 which was not treated with palladium suffered progressive corrosion from the beginning of its use at rates not as high as those of Example 2, and the surface of the window foil 4 which was treated with palladium suffered no corrosion at all after those hours of irradiation by the electron beam E.

TABLE 3

| | Reduction in weight ($g/m^2$) | |
|---|---|---|
| Irradiation time (hours) | Window foil treated with palladium | Window foil not treated with palladium |
| 120 | 0 | 17 |
| 240 | 0 | 35 |
| 360 | 0 | 55 |

EXAMPLE 4

Figure 5:
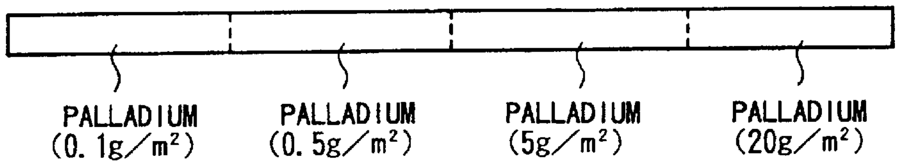
FIG. 5 is a view of a specimen used in another experimental example.

Air G containing 10% of moisture and 800 ppm of sulfur oxides and having a temperature of 60° C. was introduced into the inlet of the process vessel 1 shown in FIG. 1. While the wet air G was flowing through the process vessel 1, it was irradiated with electron beam E which was generated by the electron beam accelerator 2 at an acceleration voltage of 500 kV and a current of 20 mA. Thereafter, the wet air G was discharged from the outlet of the process vessel 1. The electron beam accelerator 2 was connected to the process vessel 1 in the same manner as Examples 1 through 3. The window foils 3 and 4 were cooled in the same manner as Examples 1 through 3. The window foil 4 comprised a foil made of pure titanium and had a thickness of 50 μm. As shown in FIG. 5, successive portions of a surface of the window foil 4 which contacted the wet air G was treated, i.e., coated, with different amounts of palladium per 1 $m^2$ of the surface of the window foil 4. A layer containing nitrogen and/or oxygen of the surface of the window foil made of pure titanium had a thickness of 0.1 μm or less.

After the wet air G was irradiated with electron beam for 360 hours, the weights of the respective portions of the window foil 4 were measured. Only the portion of the window foil 4 where the weight of palladium per 1 $m^2$ of the surface of the window foil 4 was 0.1 g suffered a reduction of 20 $g/m^2$ in weight. This indicates the fact that the corrosion developed into the pure titanium as a base metal.

EXAMPLE 5

Air G containing 20% of moisture and 5000 ppm of sulfur oxides and having a temperature of 60° C. was introduced into the inlet of the process vessel 1 shown in FIG. 1. While the wet air G was flowing through the process vessel 1, it was irradiated with electron beam E which was generated by the electron beam accelerator 2 at an acceleration voltage of 500 kV and a current of 20 mA. Thereafter, the wet air G was discharged from the outlet of the process vessel 1. The electron beam accelerator 2 was connected to the process vessel 1 in the same manner as Examples 1 through 4, and the window foils 3 and 4 were cooled in the same manner as Examples 1 through 4. Two window foils were used as the window foil 4. One window foil comprised a foil made of pure titanium and had a thickness of 50 μm. The entire surface of the window foil being in contact with the air was coated with 1 g of palladium per 1 $m^2$. This window foil is referred to as a window foil of titanium treated with palladium. The other window foil comprised a foil made of an alloy containing titanium, 3% of aluminum and 2.5% of vanadium, and had a thickness of 50 μm. The entire surface of the window foil being in contact with the air was coated with 1 g of palladium per 1 $m^2$. This window foil is referred to as a window foil of Ti—Al—V alloy treated with palladium. A layer containing nitrogen and/or oxygen of the surface of each of the window foil of titanium treated with palladium and the window foil of Ti—Al—V alloy treated with palladium had a thickness of 0.1 μm or less.

After the wet air G was irradiated with electron beam for 120 hours, 240 hours and 360 hours, the weights of the window foils 4 were measured. Reduction in weight per 1 $m^2$ is shown in Table 4 below. The window foil of titanium treated with palladium suffered slight corrosion as time elapsed from the start of irradiation by the electron beam E. However, the window foil of Ti—Al—V alloy treated with palladium suffered no corrosion at all after those hours of irradiation by the electron beam E.

TABLE 4

| | Reduction in weight (g/m²) | |
|---|---|---|
| Irradiation time (hours) | Window foil of titanium treated with palladium | Window foil of Ti—Al—V alloy treated with palladium |
| 120 | 0 | 0 |
| 240 | 0 | 0 |
| 360 | 5 | 0 |

COMPARATIVE EXAMPLE 1

Figure 6A:
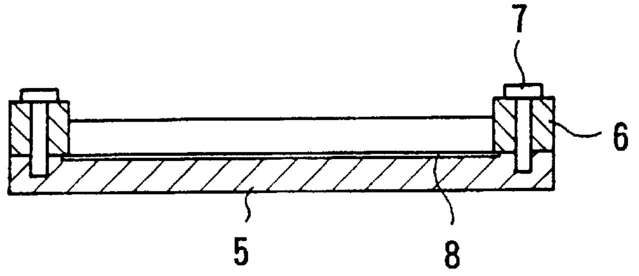
FIG. 6A is a vertical cross-sectional view of a testing device used in still another experimental example.
Figure 6B:
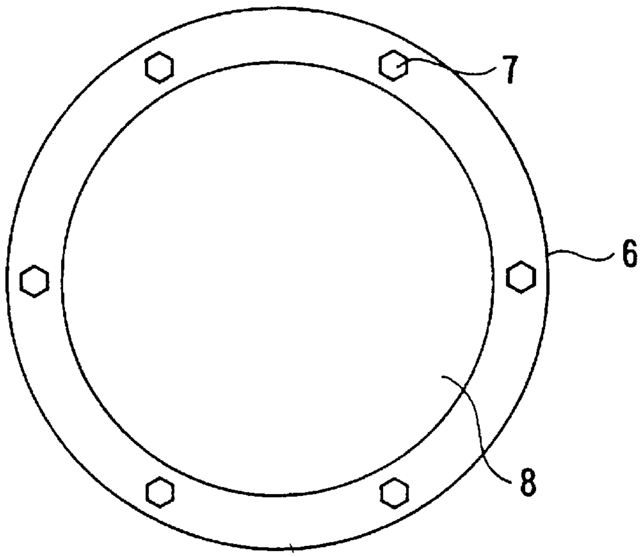
FIG. 6B is a plan view of the testing device shown in FIG. 6A.

A testing device shown in FIGS. 6A and 6B was used to hold a metal foil 8 by a disk-shaped bottom plate 5 of Teflon (trademark) and an annular member 6 fixed to the bottom plate by bolts 7. 30% of sulfuric acid was supplied into the testing device over the metal foil 8. After the metal foil 8 was held under the sulfuric acid for 120 hours, 240 hours and 360 hours, the weight of the metal foil 8 was measured. Three foils were prepared as the metal foil 8. One of the three foils comprised a foil made of pure titanium and having a thickness of 50 μm. This foil is referred to as a pure-titanium foil. Another foil comprised of a foil made of an alloy containing titanium and 0.15% of palladium and having a thickness of 50 μm. This foil is referred to as a palladium-alloy foil. The third foil comprised of a foil made of pure titanium and having a thickness of 50 μm, the foil being treated with palladium on its surface which will be in contact with gas. This foil is referred to as a palladium-treated foil. The weight of palladium which covers the surface of the palladium-treated foil which contacts liquid was 1 g per 1 $m^2$ of the surface of the foil.

Table 5 given below shows reduction in weight per 1 $m^2$ of these metal foils. It can be seen from Table 5 that only the pure-titanium foil suffered corrosion, but neither the palladium-alloy foil nor the palladium-treated foil developed any corrosion. Under the given environment, both the palladium-alloy foil and the palladium-treated foil exhibited the same corrosion resistance.

TABLE 5

| | Reduction in weight (g/m²) | | |
|---|---|---|---|
| Holding time (hours) | Pure-titanium foil | Palladium-alloy foil | Palladium-treated foil |
| 120 | 30 | 0 | 0 |
| 240 | 65 | 0 | 0 |
| 360 | 105 | 0 | 0 |

As is apparent from the above description, the present invention offers the following advantages:

Since the window foil which allows electron beam to pass therethrough and has a surface for contacting wet gas is made of titanium or an alloy containing titanium as main component, and the surface of the window foil which contacts the wet gas is coated with one of the platinum metals such as palladium, the window foil does not lower the penetrability to the electron beam, and is highly resistant to corrosion which would otherwise be caused by the wet gas, particularly gas that contains sulfur oxides and/or nitrogen oxides, in addition to moisture. When the electron-beam irradiation apparatus incorporating the window foil is used in connection with treatment of flue gas that is produced when fossil fuels such as coal and petroleum are combusted, the apparatus provides a high maintenance capability, and can improve treatment performance of flue gas.

Even when moisture is condensed on the window foil, the window foil is free of the danger of corrosion. Therefore, gas having a temperature equal to or lower than the dew point of the gas to be irradiated may be used as cooling gas for cooling the window foil. Since such cooling gas does not need to be heated, no heat source is required, and hence the apparatus may be of compact structure. Consequently, the window foil may be cooled with high efficiency, and energy saving can be achieved. It is possible to use water, rather than the cooling gas, to cool the window foil for increased cooling efficiency.

Although certain preferred embodiments of the present invention have been shown and described in detail, it should be understood that various changes and modifications may be made therein without departing from the scope of the appended claims.

The present invention is suitable for a flue gas treatment system in which sulfur oxides and/or nitrogen oxides contained in the combustion flue gas of various fuels such as coal or petroleum can be removed from the gas at a high efficiency.

We claim:

1. An electron-beam irradiation apparatus for irradiating wet gas containing moisture with an electron beam, comprising:

a vacuum container for generating the electron beam;

a process vessel for containing the wet gas; and a window foil for partitioning said vacuum container from said process vessel and allowing the electron beam to pass therethrough, said window foil having a surface for contacting the wet gas and being made of titanium or an alloy containing titanium as main component, and said surface being coated with one of platinum metals.

2. An apparatus according to claim 1, wherein said one of the platinum metals has a weight ranging from 0.2 to 100 g per 1 $m^2$ of said surface of said window foil.

3. An apparatus according to claim 2, wherein said window foil has a surface layer containing nitrogen and/or oxygen, said surface layer having a thickness of 0.2 $\mu$m or less.

4. An apparatus according to claim 2, wherein said window foil has a surface layer container nitrogen and/or oxygen, said surface layer having a thickness of 0.1 $\mu$m or less.

5. An apparatus according to claim 2, wherein said one of the platinum metals comprises palladium.

6. An apparatus according to claim 2, wherein cooling gas having a temperature of a dew point of the wet gas or below is applied to said window foil to cool said window foil.

7. An apparatus according to claim 1, wherein said window foil is made of an alloy containing titanium, aluminum and vanadium.

8. An apparatus according to claim 7, wherein said window foil has a surface layer containing nitrogen and/or oxygen, said surface layer having a thickness of 0.2 $\mu$m or less.

9. An apparatus according to claim 7, wherein said window foil has a surface layer container nitrogen and/or oxygen, said surface layer having a thickness of 0.1 $\mu$m or less.

10. An apparatus according to claim 7, wherein said one of the platinum metals comprises palladium.

11. An apparatus according to claim 7, wherein cooling gas having a temperature of a dew point of the wet gas or below is applied to said window foil to cool said window foil.

12. An apparatus according to claim 1, wherein said window foil has a surface layer containing nitrogen and/or oxygen, said surface layer having a thickness of 0.2 $\mu$m or less.

13. An apparatus according to claim 12, wherein said one of the platinum metals comprises palladium.

14. An apparatus according to claim 12, wherein cooling gas having a temperature of a dew point of the wet gas or below is applied to said window foil to cool said window foil.

15. An apparatus according to claim 1, wherein said window foil has a surface layer containing nitrogen and/or oxygen, said surface layer having a thickness of 0.1 $\mu$m or less.

16. An apparatus according to claim 15, wherein said one of the platinum metals comprises palladium.

17. An apparatus according to claim 15, wherein cooling gas having a temperature of a dew point of the wet gas or below is applied to said window foil to cool said window foil.

18. An apparatus according to claim 1, wherein said one of the platinum metals comprises palladium.

19. An apparatus according to claims 1, wherein cooling gas having a temperature of a dew point of the wet gas or below is applied to said window foil to cool said window foil.

20. An apparatus according to claims 1, wherein water spray is supplied to said surface of said window foil to cool said window foil.

* * * * *